United States Patent
Shi

(10) Patent No.: US 10,143,091 B2
(45) Date of Patent: Nov. 27, 2018

(54) METHODS OF FORMING OSCILLATOR SYSTEMS HAVING ANNULAR RESONANT CIRCUITRY

(71) Applicant: Freescale Semiconductor, Inc., Austin, TX (US)

(72) Inventor: Tiefeng Shi, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 498 days.

(21) Appl. No.: 15/009,581

(22) Filed: Jan. 28, 2016

(65) Prior Publication Data

US 2016/0150654 A1    May 26, 2016

Related U.S. Application Data

(62) Division of application No. 13/194,714, filed on Jul. 29, 2011, now Pat. No. 9,270,227.

(51) Int. Cl.
| | |
|---|---|
| *H05B 6/72* | (2006.01) |
| *H05K 3/30* | (2006.01) |
| *H05B 6/66* | (2006.01) |
| *H03B 1/02* | (2006.01) |
| *H03B 5/18* | (2006.01) |

(52) U.S. Cl.
CPC .............. *H05K 3/303* (2013.01); *H03B 1/02* (2013.01); *H03B 5/1847* (2013.01); *H05B 6/66* (2013.01); *H03B 2200/0076* (2013.01); *Y10T 29/49155* (2015.01)

(58) Field of Classification Search
CPC ........ H05B 6/6447; H05B 6/66; H05B 6/664; H05B 6/68; H05B 6/681; H05B 6/682; H05B 6/683; H05B 6/685; H05B 6/687; H05B 6/705

USPC .... 219/490, 492, 702, 715, 717; 331/86, 87, 331/167

See application file for complete search history.

(56) References Cited

U.S. PATENT DOCUMENTS

| | | | |
|---|---|---|---|
| 4,692,714 A | 9/1987 | Galani | |
| 4,749,963 A | 6/1988 | Makimoto et al. | |
| 4,758,800 A | 7/1988 | DiBiase et al. | |

(Continued)

FOREIGN PATENT DOCUMENTS

| | | |
|---|---|---|
| CN | 101577528 A | 11/2009 |
| KR | 100759940 B1 | 9/2007 |

(Continued)

OTHER PUBLICATIONS

Chinese Search Report for Patent Appln. No. CN201110410571.9 (dated Jun. 2, 2016).

*Primary Examiner* — Dana Ross
*Assistant Examiner* — Brandon Harvey
(74) *Attorney, Agent, or Firm* — Sherry W. Schumm

(57) ABSTRACT

Systems and apparatus are provided for solid-state oscillators and related resonant circuitry. An exemplary oscillator system includes an amplifier having an amplifier input and an amplifier output and resonant circuitry coupled between the amplifier output and the amplifier input. In exemplary embodiments, the resonant circuitry includes an annular resonance structure that is substantially symmetrical and includes a pair of arcuate inductive elements. In accordance with one or more embodiments, the resonant circuitry includes an additional inductive element that is capacitively coupled to the annular resonance structure via an air gap to improve the quality factor of the resonant circuitry.

15 Claims, 4 Drawing Sheets

(56) References Cited

U.S. PATENT DOCUMENTS

| | | | |
|---|---|---|---|
| 6,137,237 A | 10/2000 | MacLennan et al. |
| 6,225,756 B1 | 5/2001 | Gitsevich |
| 6,313,587 B1 | 11/2001 | MacLennan et al. |
| 7,936,212 B2 | 5/2011 | Pengelly |
| 2004/0164682 A1 | 8/2004 | Hopwood et al. |
| 2009/0278599 A1 | 11/2009 | Pengelly |

FOREIGN PATENT DOCUMENTS

| | | |
|---|---|---|
| KR | 10-2009-0077510 A | 7/2009 |
| KR | 10-0759940 B1 | 9/2009 |
| KR | 100936171 B1 | 1/2010 |
| WO | 2009154929 A2 | 12/2009 |

…

METHODS OF FORMING OSCILLATOR SYSTEMS HAVING ANNULAR RESONANT CIRCUITRY

RELATED APPLICATION

This application is a divisional of co-pending U.S. patent application Ser. No. 13/194,714, filed on Jul. 29, 2011.

TECHNICAL FIELD

Embodiments of the subject matter described herein relate generally to electronic circuits, and more particularly, embodiments of the subject matter relate to resonant circuitry for microwave oscillators.

BACKGROUND

Magnetrons are commonly used to generate microwaves in microwave ovens or other microwave application. While magnetrons are well suited for this purpose, they typically require a relatively high voltage power source (e.g., 4 kilovolts or more) for operation. Additionally, the lifetime of some magnetrons may be limited or the magnetrons may otherwise be susceptible to output power degradation over extended periods of operation.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate solid-state oscillator systems for microwave applications. As described in greater detail below, exemplary oscillator systems are realized using an amplifier with a resonant circuit in the feedback path. The resonant circuit includes a pair of arcuate (or curved) inductive elements that oppose one another to provide an annular structure. As used herein, an "annular structure" should be understood as referring to a ring-like structure that has a voided interior, but the annular structure need not be perfectly circular. In exemplary embodiments, the arcuate inductive elements have substantially identical and complementary shape and/or dimensions and are capacitively coupled to each other at their opposing ends. In accordance with one or more embodiments, a rectangular inductive element is formed proximate one of the arcuate inductive elements and spaced apart from the respective arcuate inductive element such that rectangular inductive element is capacitively coupled to the arcuate inductive element via the gap capacitance introduced by the air gap between the rectangular inductive element and the arcuate inductive element. Although the subject matter is described herein in the context of microwave frequency applications, the subject matter is not intended to be limited to any particular frequency range.

Figure 1:
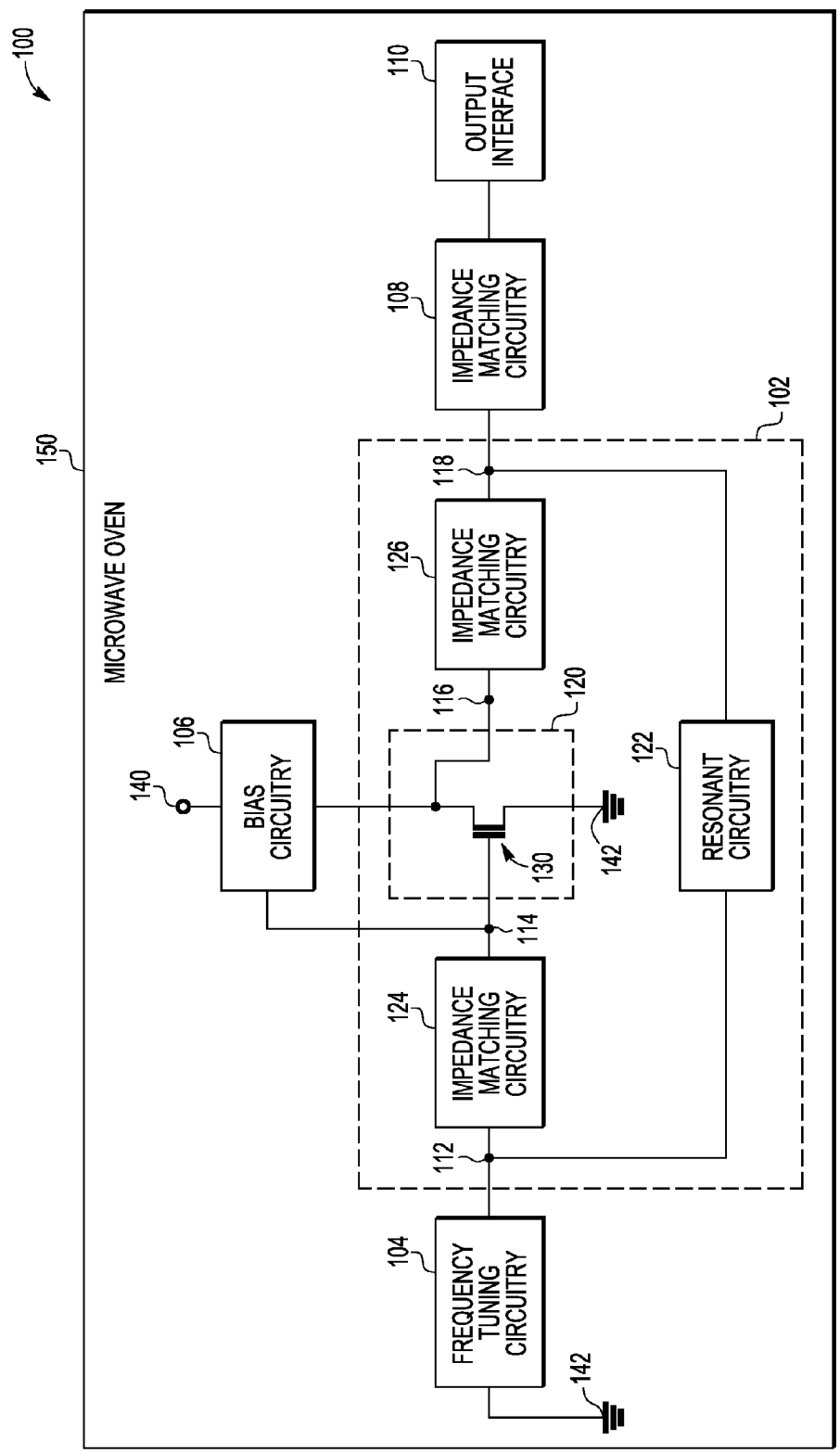
FIG. 1 is a block diagram of an exemplary oscillator system in accordance with one embodiment of the invention.

FIG. 1 depicts an exemplary embodiment of an oscillator system 100 suitable for use in a microwave oven 150. The oscillator system 100 includes, without limitation, an oscillator arrangement 102, frequency tuning circuitry 104, bias circuitry 106, output impedance matching circuitry 108, and an output interface 110. In an exemplary embodiment, the elements of the oscillator system 100 are configured to produce an oscillating electrical signal at the output interface 110 having a frequency in the microwave frequency range (e.g., 2.45 GHz) with an output power of about 100 Watts or more. It should be understood that FIG. 1 is a simplified representation of an oscillator system 100 for purposes of explanation and ease of description, and that practical embodiments may include other devices and components to provide additional functions and features, and/or the oscillator system 100 may be part of a much larger electrical system, as will be understood.

In an exemplary embodiment, the oscillator arrangement 102 includes an amplifier arrangement 120, a resonant circuitry 122, amplifier input impedance matching circuitry 124, and amplifier output impedance matching circuitry 126. The resonant circuitry 122 is coupled between the output node 116 of the amplifier arrangement 120 and the input node 114 of the amplifier arrangement 120 to provide a resonant feedback loop that causes the amplified electrical signals produced by the amplifier arrangement 120 to oscillate at or near the resonant frequency of the resonant circuitry 122. As described in greater detail below, in an exemplary embodiment, the resonant circuitry 122 is configured to provide a resonant frequency of 2.45 GHz, or in other words, the resonant circuitry 122 resonates at 2.45 GHz such that the amplified electrical signals produced by the amplifier arrangement 120 at the amplifier output 116 oscillate at or near 2.45 GHz. It should be noted that in practice, embodiments of the resonant circuitry 122 may be configured to resonate a different frequency to suit the needs of the particular application utilizing the oscillator system 100.

In the illustrated embodiment of FIG. 1, the amplifier arrangement 120 is realized as a transistor 130 having an input terminal (or control terminal) coupled to the amplifier input node 114 and an output terminal coupled to the amplifier output node 116. In the illustrated embodiment, the transistor 130 is realized as an N-type field effect transistor (FET) having a gate terminal connected to the amplifier input node 114, a drain terminal connected to the amplifier output node 116, and a source terminal connected to a node 142 configured to receive a ground reference voltage for the oscillator system 100. In an exemplary embodiment, the transistor 130 is realized as a laterally diffused metal oxide semiconductor (LDMOS) transistor. However, it should be noted that the transistor 130 is not intended to be limited to any particular semiconductor technology, and in other embodiments, the transistor 130 may be realized as a gallium nitride (GaN) transistor, a MOSFET transistor, a bipolar junction transistor (BJT), or a transistor utilizing another semiconductor technology. Additionally, in other embodiments, the amplifier arrangement 120 may be realized using any suitable amplifier topology and/or the amplifier arrangement 120 may include multiple transistors.

In an exemplary embodiment, the frequency tuning circuitry 104 generally represents the capacitive elements, inductive elements, and/or resistive elements that are configured to adjust the oscillating frequency of the oscillating electrical signals generated by the oscillator system 100. In an exemplary embodiment, the frequency tuning circuitry 104 is coupled between the ground reference voltage node 142 and the input node 112 of the oscillator arrangement 102. The bias circuitry 106 generally represents the circuit elements, components, and/or other hardware that are coupled between the amplifier arrangement 120 and a node 140 configured to receive a positive (or supply) reference voltage. In exemplary embodiments, the voltage difference between the supply voltage node 140 and the ground voltage node 142 is less than 50 Volts. The bias circuitry 106 is configured to control the direct current (DC) or nominal bias voltages at the gate and drain terminals of the transistor 130 to turn the transistor 130 on and maintain the transistor 130 operating in the saturation (or active) mode during operation of the oscillator system 100. In this regard, the bias circuitry 106 is coupled to the gate terminal of the transistor 130 of the amplifier arrangement 120 at the amplifier input node 114 and the drain terminal of the transistor 130 at the amplifier output node 116. In accordance with one or more embodiments, the bias circuitry 106 includes temperature compensation circuitry configured to sense or otherwise detect the temperature of the transistor 130 and adjust the gate bias voltage at the amplifier input node 114 in response to increases and/or decreases in the temperature of the transistor 130 to maintain substantially constant quiescent current for the transistor 130 in response to temperature variations.

As illustrated, the oscillator arrangement 102 includes amplifier input impedance matching circuitry 124 coupled between the resonant circuitry 122 at the input node 112 of the oscillator arrangement 102 and the amplifier input 114, wherein the impedance matching circuitry 124 is configured to match the input impedance of the amplifier arrangement 120 at the amplifier input node 114 to the impedance of the resonant circuitry 122 and the frequency tuning circuitry 104 at node 112 at the resonant frequency of the resonant circuitry 122. Similarly, the amplifier output impedance matching circuitry 126 is coupled between the amplifier output 116 and the resonant circuitry 122 to match the output impedance of the amplifier arrangement 120 at the amplifier output node 116 to the impedance of the resonant circuitry 122 at the output node 118 of the oscillator arrangement 102 at the resonant frequency.

In an exemplary embodiment, the output impedance matching circuitry 108 is coupled between output node 118 of the oscillator arrangement 102 and the output interface 110, and the output impedance matching circuitry 108 is configured to match the input impedance of the output interface 110 to the impedance at the oscillator output node 118. The output interface 110 generally represents the combination of one or more antennas, waveguides, and/or other hardware components configured to translate the oscillating electrical signals at the oscillator output node 118 to electromagnetic signals at the oscillating frequency. For example, in a microwave oven application where the resonant circuitry 122 is configured to provide a resonant frequency of 2.45 GHz, the output interface 110 translates the oscillating electrical signals at the oscillator output node 118 to microwave electromagnetic signals at 2.45 GHz and directs the microwave signals into the cooking chamber of the microwave oven.

Figure 2:
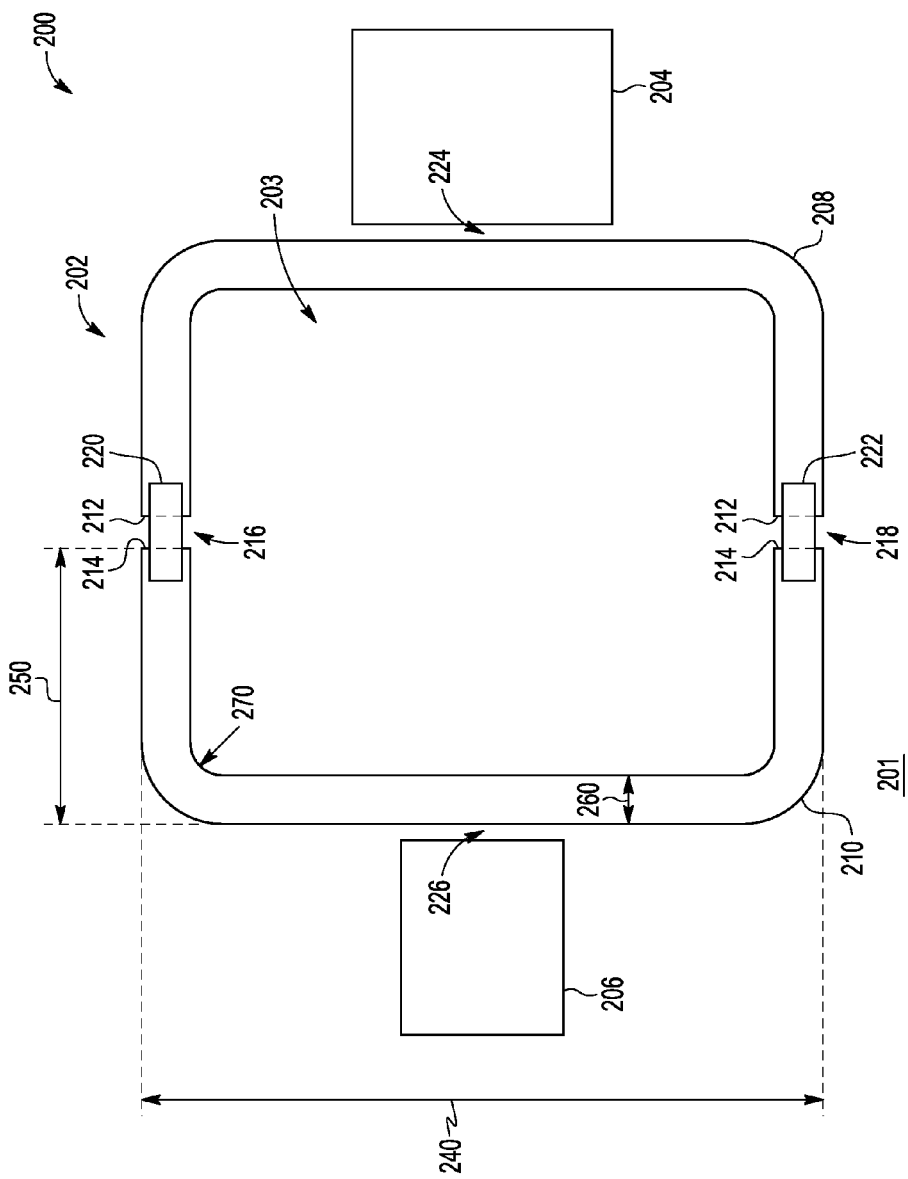
FIG. 2 is a top view of exemplary resonant circuitry suitable for use in the oscillator system of FIG. 1 in accordance with one embodiment of the invention.

Turning now to FIG. 2, in an exemplary embodiment, the resonant circuitry 122 of the oscillator system 100 of FIG. 1 is realized as resonant circuit 200. The resonant circuit 200 includes an annular resonance structure 202 and a pair of inductive elements 204, 206. The annular resonance structure 202 includes a pair of arcuate (or curved) inductive elements 208, 210 that are capacitively coupled at their longitudinal ends 212, 214. The arcuate inductive elements 208, 210 are substantially identical and complementary in shape, such that the arcuate inductive elements 208, 210 provide a symmetrical annular structure 202 having a voided interior region 203 when their longitudinal ends 212, 214 face or otherwise oppose those of the other arcuate inductive element 208, 210, as illustrated in FIG. 2. To put it another way, the arcuate inductive elements 208, 210 are curved inward towards one another to provide a symmetrical annular structure 202 that encompasses a voided interior region 203. By virtue of the inductive elements 208, 210 being substantially identical in shape, the inductive elements 208, 210 have substantially identical electrical characteristics to provide a relatively high quality factor (or Q value) for the resonant circuit 200. In the illustrated embodiment, the arcuate inductive elements 208, 210 are substantially U-shaped such that the annular resonance structure 202 is substantially rectangular with rounded corners, however, in other embodiments, the arcuate inductive elements 208, 210 may substantially C-shaped such that the annular resonance structure 202 is substantially circular, as described in greater detail below in the context of FIG. 4. In this regard, the overall shape of the annular resonance structure 202 may vary depending on area or layout requirements or other design constraints for a particular embodiment. In an exemplary embodiment, the inductive elements 208, 210 are each realized as a microstrip or another conductive material (e.g., a conductive metal trace) formed on an electrical substrate 201, such as a printed circuit board. The physical dimensions of the inductive elements 208, 210 are chosen to provide a desired inductance such that the annular resonance structure 202 resonates at a desired frequency. For example, the length and width of the inductive elements 208, 210 may be chosen such that the annular resonance structure 202 resonates at a frequency of about 2.45 GHz. In accordance with one embodiment, to provide a resonant frequency of about 2.45 GHz with a conductive metal material (or microstrip) having a thickness of about 0.0024 inches, the length 240 of each inductive element 208, 210 in a first direction is about 1.03 inches, the length 250 of each inductive element 208, 210 in a second direction orthogonal to the first direction is about 0.42 inches, and the width 260 of each inductive element 208, 210 is about 0.058 inches with an inner radius 270 of about 0.121 inches, wherein the width of the air gaps 216, 218 between the ends of the inductive elements 208, 210 is about 0.02 inches.

As illustrated in FIG. 2, the longitudinal ends 212, 214 of the arcuate inductive elements 208, 210 are spaced apart from one another or otherwise separated to provide air gaps 216, 218 between the longitudinal ends 212, 214 of the inductive elements 208, 210. In the illustrated embodiment, the resonant circuit 200 includes a pair of capacitive elements 220, 222 coupled electrically in series between the inductive elements 208, 210. In an exemplary embodiment, each capacitive element 220, 222 is realized as a capacitor, such as a multilayer ceramic chip capacitor, that is mounted across the air gaps 216, 218 between the longitudinal ends 212, 214 of the inductive elements 208, 210 to provide a substantially continuous annular structure. In this regard, each capacitive element 220, 222 has a first terminal that is mounted, affixed, or otherwise connected to an end 212 of the first arcuate inductive element 208 and a second terminal that is mounted, affixed, or otherwise connected to the opposing end 214 of the second arcuate inductive element 210. In this manner, the capacitive elements 220, 222 are connected electrically in series between the inductive elements 208, 210. In an exemplary embodiment, the capacitances of the capacitive elements 220, 222 are substantially identical and chosen based on the inductances of the inductive elements 208, 210 such that the resonant circuit 200 resonates at a desired frequency. For example, in an exemplary embodiment, the capacitance of the capacitive elements 220, 222 is chosen such that the resonant circuit 200 resonates at a frequency of about 2.45 GHz. In an exemplary embodiment, the capacitance of the capacitive elements 220, 222 is about 2.2 picofarads.

It should be noted that in accordance with one or more alternative embodiments, the resonant circuit 200 may not include capacitive elements 220, 222. In this regard, the capacitive coupling provided by the air gaps 216, 218 between the ends 212, 214 of the inductive elements 208, 210 may provide the desired capacitance such that the resonant circuit 200 resonates at the desired frequency. For example, the physical dimensions and/or shape of the inductive elements 208, 210 may be chosen to provide a desired inductance and the size of the air gaps 216, 218 (i.e., the separation distance between ends 212, 214) may be chosen to provide a desired capacitance (for example, 2.2 picofarads) such that the resonant circuit 200 resonates at the desired resonant frequency without capacitive elements 220, 222.

Still referring to FIG. 2, the inductive elements 204, 206 generally represent the input and output terminals of the resonant circuit 200. For convenience, but without limitation, the first inductive element 204 may alternatively be referred to herein as the input inductive element and the second inductive element 206 may alternatively be referred to herein as the output inductive element. As described in greater detail below with reference to FIG. 1, in exemplary embodiments, the input inductive element 204 is coupled to the output node 118 of the oscillator arrangement 102 and the output inductive element 206 is coupled to the input node 112 of the oscillator arrangement 102.

In the illustrated embodiment of FIG. 2, the input inductive element 204 is realized as a rectangular microstrip (or another conductive material) formed on the electrical substrate 201 proximate the first arcuate inductive element 208. The input inductive element 204 is spaced apart or otherwise separated from the inductive element 208 by an air gap 224 that functions as a gap capacitor electrically in series between the inductive elements 204, 208. In this regard, the input inductive element 204 is capacitively coupled to the inductive element 208 via the gap capacitance provided by the air gap 224. In an exemplary embodiment, the separation distance between the inductive elements 204, 208 (e.g., the width of the air gap 224) is chosen to be as small as possible to increase the quality factor (or Q value) of the gap capacitance. In accordance with one embodiment, the separation distance between the inductive elements 204, 208 is about 0.01 inches or less.

In a similar manner, the output inductive element 206 is realized as another rectangular microstrip (or another conductive material) formed on the electrical substrate 201 proximate the second arcuate inductive element 210. In the illustrated embodiment, the output inductive element 206 is spaced apart or otherwise separated from the inductive element 210 by an air gap 226 that functions as a gap capacitor between the inductive elements 206, 210 in a similar manner as described above with respect to air gap 224. The inductive elements 204, 206 are substantially rectangular in shape, and the dimensions of the respective inductive elements 204, 206 are chosen to provide a desired input and/or output impedance for the resonant circuit 200 at the resonant frequency of the resonant circuit 200, as described in greater detail below. It should be noted that although FIG. 2 depicts air gaps 224, 226 between the both of the inductive elements 204, 206, in accordance with one or more alternative embodiments, one of the inductive elements 204, 206 may be electrically connected to the annular resonance structure 202 without a series capacitance. For example, in accordance with one embodiment, the output inductive element 206 may be formed to physically contact the annular resonance structure 202 and/or arcuate inductive element 210. In this regard, the inductive element 206 may be integrally formed with the arcuate inductive element 210 of the annular resonance structure 202. In an exemplary embodiments, at least one of the inductive elements 204, 206 is separated from the annular resonance structure 202 by an air gap 224, 226 to increase the quality factor (or Q value) of the resonant circuit 200. In an exemplary embodiment, the quality factor (or Q value) of the resonant circuit 200 is about 190 or more.

Fabrication of the resonant circuit 200 may be achieved by forming the inductive elements 204, 206, 208, 210 on the electrical substrate 201 and forming capacitive elements 220, 222 coupled between the longitudinal ends 212, 214 of the arcuate inductive elements 208, 210. In this regard, the fabrication process may begin by forming a layer of conductive material overlying the electrical substrate 201 and selectively removing portions of the conductive material to provide the arcuate inductive elements 208, 210 that define the annular resonance structure 202 having the voided interior region 203 (e.g., an exposed region of the electrical substrate 201 substantially encompassed by the arcuate inductive elements 208, 210) and the inductive elements 204, 206 proximate the arcuate inductive elements 208, 210. As described above, portions of the conductive material between at least one of the inductive elements 204, 206 and a respective arcuate inductive element 208, 210 are removed to provided a gap capacitance in series between that respective inductive element 204, 206 and the respective arcuate inductive element 208, 210 proximate the respective inductive element 204, 206. Additionally, portions of the conductive material are removed to provide air gaps 216, 218 between the longitudinal ends 212, 214 of the arcuate inductive elements 208, 210. After forming the inductive elements 204, 206, 208, 210, the fabrication of the resonant circuit 200 may be completed by mounting, soldering, or otherwise affixing capacitive elements 220, 222 to the longitudinal ends 212, 214 of the arcuate inductive elements 208, 210 that span the air gaps 216, 218 and capacitively couple the arcuate inductive elements 208, 210.

Referring now to FIGS. 1-2, in an exemplary embodiment, the resonant circuitry 122 in the oscillator system 100 is realized as resonant circuit 200 such that the annular resonance structure 202 is coupled between the output of the amplifier arrangement 120 and the input of the amplifier arrangement 120. In this regard, the input inductive element 204 is electrically coupled to node 118 and the output inductive element 206 is electrically coupled to node 112. For example, the amplifier output impedance matching circuitry 126 may include a microstrip formed on the electrical substrate 201 that is connected to or otherwise integral with the input inductive element 204 and the amplifier input impedance matching circuitry 124 may include a second microstrip that is connected to or otherwise integral with the output inductive element 206. The physical dimensions of the input inductive element 204 are chosen to match the input impedance of the resonant circuit 200 to the impedance at node 118, and similarly, the physical dimensions of the output inductive element 206 are chosen to match the output impedance of the resonant circuit 200 to the impedance at node 112. In this regard, in an exemplary embodiment, the impedances of the impedance matching circuitry 124, 126 and the impedances of the inductive elements 204, 206 and air gaps 224, 226 are cooperatively configured to provide a desired gain for the oscillator arrangement 102 at the resonant frequency of the resonant circuitry 122, 200.

Figure 3:
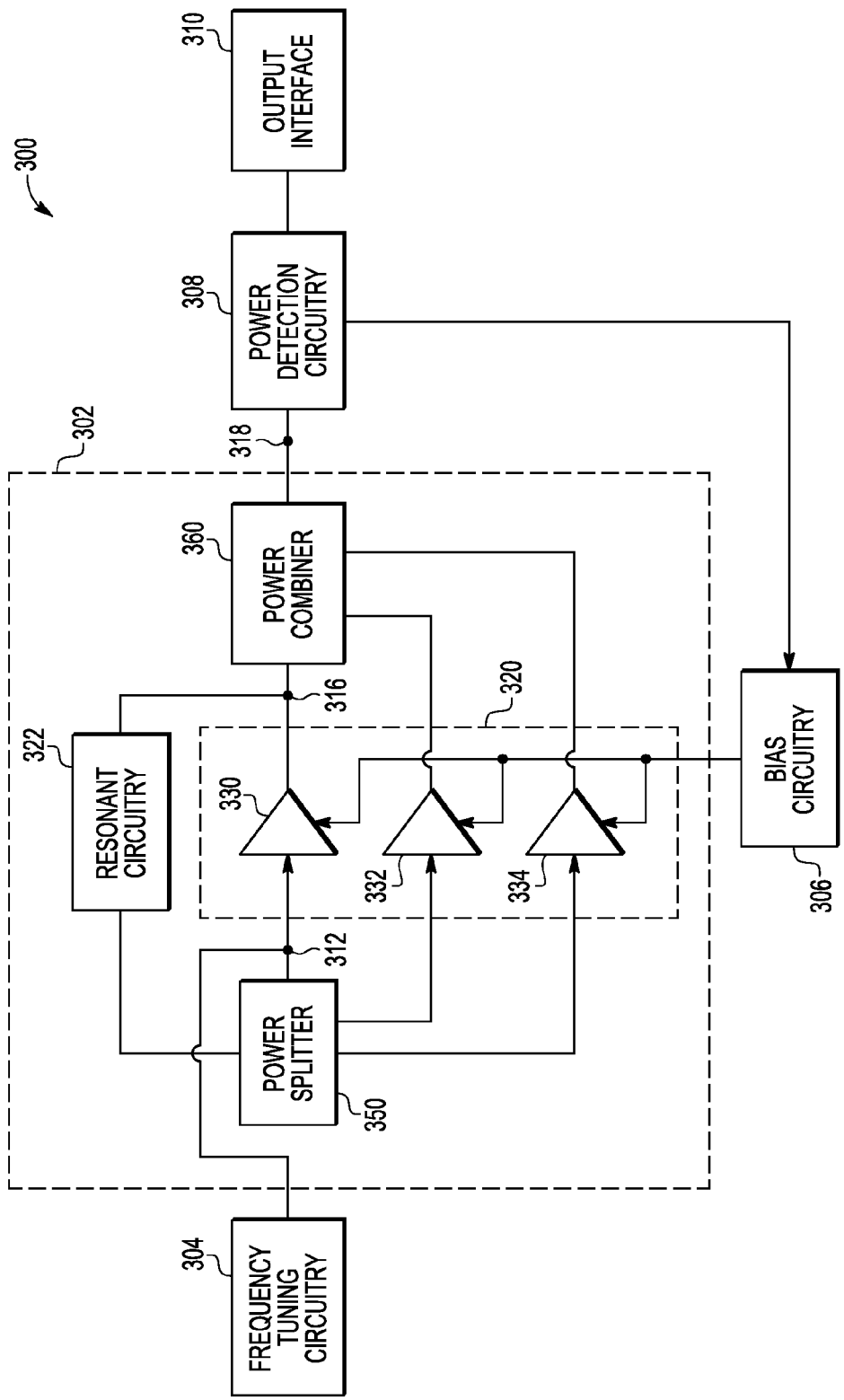
FIG. 3 is block diagram of another exemplary oscillator system suitable for use with the resonant circuit of FIG. 2 in accordance with one embodiment of the invention.

FIG. 3 depicts another exemplary embodiment of an oscillator system 300 suitable for use with the resonant circuit 200 of FIG. 2. The oscillator system 300 includes, without limitation, an oscillator arrangement 302, frequency tuning circuitry 304, bias circuitry 306, power detection circuitry 308, and an output interface 310. Various elements in the oscillator system 300 of FIG. 3 are similar to counterpart elements described above in the context of the oscillator system 100 of FIG. 1, and accordingly, the details of these common elements will not be redundantly described in the context of FIG. 3. As described above, the elements of the oscillator system 300 are configured to produce an oscillating electromagnetic signal at the output interface 310 having a frequency in the microwave frequency range. It should be understood that FIG. 3 is a simplified representation of an oscillator system 300 for purposes of explanation and ease of description, and that practical embodiments may include other devices and components to provide additional functions and features, and/or the oscillator system 300 may be part of a much larger electrical system, as will be understood. For example, in practice, the oscillator system 300 will include one or more instances of impedance matching circuitry as described above in the context of FIG. 1 to match impedances within the oscillator system 300, as will be appreciated in the art.

In the illustrated embodiment of FIG. 3, the amplifier arrangement 320 includes a plurality of amplifiers 330, 332, 334 and the oscillator arrangement 302 includes a power splitter (or power divider) 350 configured to divide the input power of the oscillating signal from the resonant circuitry 322 among the amplifiers 330, 332, 334, such that the input of each amplifier 330, 332, 334 receives a portion of the oscillating signal to be amplified by the amplifier arrangement 320. In an exemplary embodiment, each amplifier 330, 332, 334 is realized as a transistor having an input (or control) terminal (e.g., a gate terminal) coupled to a respective output of the power splitter 350 and an output terminal (e.g., a drain terminal) coupled to the oscillator output node 318. In an exemplary embodiment, the oscillator arrangement 302 includes a power combiner 360 coupled to the outputs of the amplifiers 330, 332, 334 to combine the amplified output signals to produce an amplified version of the oscillating signal generated by the primary amplifier 330.

As illustrated in FIG. 3, the bias circuitry 306 is coupled to the amplifiers 330, 332, 334 and controls the DC (or nominal) bias voltages at the gate and drain terminals of the transistors 330, 332, 334, in a similar manner as described above in the context of the bias circuitry 106 of FIG. 1. In an exemplary embodiment, the bias circuitry 306 is configured to bias the primary amplifier 330 to operate in the Class AB mode (e.g., a conduction angle between 180 and 360 degrees) and bias the secondary amplifiers 332, 334 to operate in the Class C mode (e.g., a conduction angle less than 180 degrees). In accordance with one or more embodiments, the secondary amplifiers 332, 334 are biased for Class C operation, such that the secondary amplifiers 332, 334 are turned on when the signal power (or voltage) at the input 312 of the primary amplifier 330 is greater than a threshold amount that indicates that the primary amplifier 330 is at or near saturation. In this manner, the amplifier arrangement 320 operates similarly to a Doherty amplifier, wherein the secondary amplifiers 332, 334 supplement the output power provided by the primary amplifier 330 to increase the power output of the oscillator system 300. In other embodiments, the secondary amplifiers 332, 334 may be biased or otherwise configured to operate in different modes other than Class C (e.g., Class AB, Class B, etc.) to achieve different levels of efficiency. Furthermore, it should be noted the number of secondary amplifiers in a practical embodiment of the oscillator system 300 may vary depending on the needs of a particular application (e.g., more or less than two secondary amplifiers may be utilized). In this regard, embodiments of the oscillator system 300 that include only an individual secondary amplifier may be realized without the power splitter 350, with the input of the secondary amplifier being coupled to the input of the primary amplifier 330 at node 312.

As illustrated in FIG. 3, the resonant circuitry 322 is coupled between the output node 316 of the primary amplifier 330 and the input node 312 of the primary amplifier 330 via the power splitter 350. In an exemplary embodiment, the resonant circuitry 322 is realized as resonant circuit 200 of FIG. 2 and includes an annular resonance structure 202 that causes the amplified electrical signals produced by the primary amplifier 330 to oscillate at or near the resonant frequency of the resonant circuitry 322. The frequency tuning circuitry 304 is coupled to the input node 312 of the primary amplifier 330 to facilitate adjustment of the oscillation frequency of the oscillation signals generated by the primary amplifier 330.

In an exemplary embodiment, the power detection circuitry 308 is coupled between the oscillator output 318 and the output interface 310. The power detection circuitry 308 generally represents the circuit elements, components, and/or other hardware configured to monitor, measure, or otherwise detect the power of the oscillating signals provided to the output interface 310. In an exemplary embodiment, the power detection circuitry 308 is also configured to monitor or otherwise measure the power of signal reflections from the output interface 310. The power detection circuitry 308 is coupled to the bias circuitry 306, and in response to detecting the power of the signal reflections exceeds a threshold value, the power detection circuitry 308 signals the bias circuitry 306 to turn off or otherwise disable the amplifiers 330, 332, 334 of the amplifier arrangement 320. In this manner, the power detection circuitry 308 and the bias circuitry 306 are cooperatively configured to protect the amplifiers 330, 332, 334 from signal reflections in response to changes in the impedance at the output interface 310.

Figure 4:
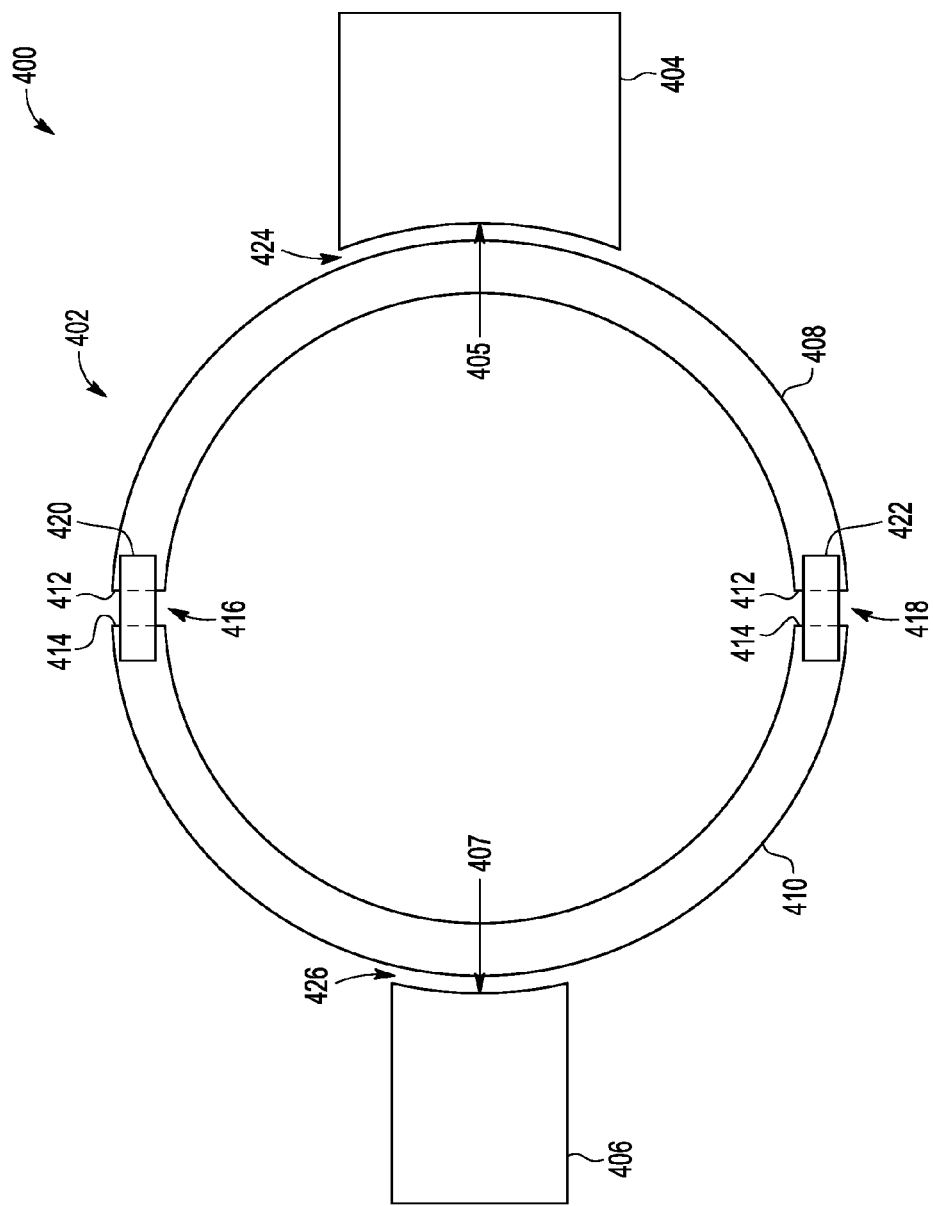
FIG. 4 is a top view of another exemplary embodiment of resonant circuitry suitable for use in the oscillator system of FIG. 1 or the oscillator system of FIG. 3.

FIG. 4 depicts another exemplary embodiment of a resonant circuit 400 suitable for use as the resonant circuitry 122 in the oscillator system 100 of FIG. 1 or the resonant circuitry 322 in the oscillator system 300 of FIG. 3. The resonant circuit 400 includes an annular resonance structure 402 and a pair of inductive elements 404, 406. The annular resonance structure 402 includes a pair of arcuate (or curved) inductive elements 408, 410 that are capacitively coupled at their longitudinal ends 412, 414 by capacitive elements 420, 422 mounted across air gaps 416, 418 between the longitudinal ends 412, 414 in a similar manner as described above in the context of FIG. 2. In the illustrated embodiment of FIG. 4, the arcuate inductive elements 408, 410 are substantially C-shaped and face each other such that the annular resonance structure 402 is substantially circular. The inductive elements 404, 406 are conformal to the annular resonance structure 402, that is, the edges 405, 407 of the inductive elements 404, 406 proximate the arcuate inductive elements 408, 410 are arcuate or curved to conform to the outer edges of the arcuate inductive elements 408, 410 to improve the capacitive coupling between the inductive elements 404, 406 and the annular resonance structure 402. In a similar manner as described above in the context of FIG. 2, the physical dimensions of the inductive elements 404, 406, 408, 410 are chosen to provide a desired inductance and the capacitive elements 420, 422 and air gaps 424, 426 are configured to provide a desired capacitance such that the annular resonance structure 402 resonates at a desired frequency with a relatively high quality factor (or Q value).

One advantage of the resonant circuits and oscillator systems described above is that the oscillator systems are capable of producing microwave signals having an equivalent output power to those produced by conventional magnetrons at a lower voltage. For example, an output power greater than 100 Watts may be achieved with a supply voltage of 28 Volts. Additionally, the annular resonant circuitry has a relatively high quality factor (e.g., a Q value greater than 100) that reduces variations in the oscillating frequency of the output signals with respect to variations in the supply voltage and/or the load impedance.

For the sake of brevity, conventional techniques related to resonators, amplifiers, biasing, load modulation, impedance matching, power splitters and/or power combiners, microwave applications, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

In conclusion, systems, devices, and methods configured in accordance with example embodiments of the invention relate to:

An exemplary embodiment of an oscillator system is provided. The oscillator system includes a first amplifier having a first amplifier input and a first amplifier output, and an annular resonance structure coupled between the first amplifier output and the first amplifier input. In one embodiment, the oscillator system includes an inductive element coupled between the first amplifier and the annular resonance structure, wherein the inductive element is disposed proximate the annular resonance structure and separated from the annular resonance structure by an air gap, the inductive element being coupled to the annular resonance structure via a capacitance provided by the air gap. In accordance with one or more exemplary embodiments, the annular resonance structure comprises a first arcuate inductive element and a second arcuate inductive element capacitively coupled to the first arcuate inductive element. In one embodiment, the oscillator system includes a third inductive element coupled between the first amplifier and the first arcuate inductive element, wherein the third inductive element is disposed proximate the first arcuate inductive element and separated from the first arcuate inductive element by an air gap to provide a capacitance between the third inductive element and the first arcuate inductive element, and the third inductive element is capacitively coupled to the first arcuate inductive element via the capacitance. In exemplary embodiments, the first arcuate inductive element and the second arcuate inductive element are complementary in shape and the annular resonance structure is symmetrical. The first arcuate inductive element has a first pair of ends and the second arcuate inductive element has a second pair of ends, wherein the first pair of ends are capacitively coupled to the second pair of ends. In one embodiment, the arcuate inductive elements each comprise a substantially U-shaped conductive material. In another embodiment, the arcuate inductive elements each comprise a substantially C-shaped conductive material. In accordance with one or more embodiments, the oscillator system includes a second amplifier having a second amplifier input coupled to the first amplifier input and second amplifier output, and a power combiner having a first input coupled to the first amplifier output and a second input coupled to the second amplifier output. In a further embodiment, the first amplifier is configured to operate in Class AB mode and the second amplifier is configured to operate in Class C mode. In another embodiment, the oscillator system further includes a third amplifier having a third amplifier input and a third amplifier output coupled to a third input of the power combiner, and a power splitter having an input coupled to the first amplifier input, a first output coupled to the second amplifier input, and a second output coupled to the third amplifier input. In one embodiment, a microwave oven is provided that includes the oscillator system.

Another exemplary embodiment of an oscillator system includes an amplifier having an amplifier input and an amplifier output, and resonant circuitry coupled between the amplifier input and the amplifier output, wherein the resonant circuitry includes a first curved inductive element and a second curved inductive element capacitively coupled to the first curved inductive element, and the first curved inductive element and the second curved inductive element are cooperatively configured to provide an annular resonance structure. In one embodiment, the oscillator system includes a third inductive element disposed proximate the first curved inductive element and separated from the first curved inductive element by an air gap to provide a capacitance between the third inductive element and the first curved inductive element, wherein the third inductive element is capacitively coupled to the first curved inductive element via the capacitance. In a further embodiment, the oscillator system includes a fourth inductive element disposed proximate the second curved inductive element and separated from the second curved inductive element by a second air gap to provide a second capacitance between the fourth inductive element and the second curved inductive element, wherein the fourth inductive element is capacitively coupled to the second curved inductive element via the second capacitance. In accordance with another embodiment, the first curved inductive element and the second curved inductive element are complementary in shape and substantially oppose one another. In one embodiment, the oscillator system includes a first capacitive element having a first terminal coupled to a first longitudinal end of the first curved inductive element and a second terminal coupled to a first longitudinal end of the second curved inductive element, the first longitudinal end of the second curved inductive element facing the first longitudinal end of the first curved inductive element, and a second capacitive element having a third terminal coupled to a second longitudinal end of the first curved inductive element and a fourth terminal coupled to a second longitudinal end of the second curved inductive element, the second longitudinal end of the second curved inductive element facing the second longitudinal end of the first curved inductive element.

In yet another embodiment, a method is provided for forming a resonant circuit. An exemplary method involves forming a first arcuate inductive element on an electrical substrate and forming a second arcuate inductive element on the electrical substrate spaced apart from the first arcuate inductive element, the second arcuate inductive element substantially opposing the first arcuate inductive element to provide an annular resonance structure. In one embodiment, the method continues by forming a third inductive element on the electrical substrate proximate the first arcuate inductive element, wherein the third inductive element is spaced apart from the first arcuate inductive element by an air gap, the third inductive element being capacitively coupled to the first arcuate inductive element via the air gap.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for forming an oscillator arrangement that includes a resonant circuit, the method comprising:
    forming a first inductive element on an electrical substrate; and
    forming a second inductive element on the electrical substrate spaced apart from the first inductive element, the second inductive element substantially opposing the first inductive element to provide an annular resonance structure, wherein the first and second inductive elements have substantially identical electrical characteristics, the first and second inductive elements curve towards one another so that the annular resonance structure encompasses a voided interior region, a first longitudinal end of the first inductive element faces a first longitudinal end of the second inductive element across a first air gap, and a second longitudinal end of the first inductive element faces a second longitudinal end of the second inductive element across a second air gap.

2. The method of claim 1, further comprising:
    forming a third inductive element coupled between a first amplifier and the annular resonance structure, wherein the third inductive element is disposed proximate the annular resonance structure and separated from the annular resonance structure by a third air gap, the third inductive element being coupled to the annular resonance structure via a capacitance provided by the third air gap.

3. The method of claim 1, wherein:
    the first inductive element is a first arcuate inductive element,
    the second inductive element is a second arcuate inductive element, and wherein the method further comprises
        coupling a first capacitive element between the first longitudinal ends of the first and second arcuate inductive elements; and
        coupling a second capacitive element between the second longitudinal ends of the first and second arcuate inductive elements.

4. The method of claim 3, further comprising:
    forming a third inductive element coupled between the first amplifier and the first arcuate inductive element, wherein:
    the third inductive element is disposed proximate the first arcuate inductive element and separated from the first arcuate inductive element by a third air gap to provide a capacitance between the third inductive element and the first arcuate inductive element, and
    the third inductive element is capacitively coupled to the first arcuate inductive element via the capacitance.

5. The method of claim 3, wherein the first arcuate inductive element and the second arcuate inductive element are complementary in shape.

6. The method of claim 3, wherein the annular resonance structure is symmetrical.

7. The method of claim 3, wherein:
    the first arcuate inductive element comprises a first substantially C-shaped conductive material; and
    the second arcuate inductive element comprises a second substantially C-shaped conductive material.

8. The method of claim 3, wherein:
the first arcuate inductive element comprises a first substantially U-shaped conductive material; and
the second arcuate inductive element comprises a second substantially U-shaped conductive material.

9. The method of claim 1, wherein the annular resonance structure is symmetrical.

10. The method of claim 1, further comprising:
coupling an amplifier to the annular resonance structure by coupling the first inductive element to an output of the amplifier, and coupling the second inductive element to an input of the amplifier.

11. The method of claim 1, further comprising:
coupling a first capacitive element between the first longitudinal ends of the first and second inductive elements; and
coupling a second capacitive element between the second longitudinal ends of the first and second inductive elements.

12. The method of claim 11, further comprising:
disposing a third inductive element proximate the first inductive element and separated from the first inductive element by a third air gap to provide a capacitance between the third inductive element and the first inductive element, wherein the third inductive element is capacitively coupled to the first inductive element via the capacitance.

13. The method of claim 12, further comprising:
disposing a fourth inductive element proximate the second inductive element and separated from the second inductive element by a fourth air gap to provide a second capacitance between the fourth inductive element and the second inductive element, wherein the fourth inductive element is capacitively coupled to the second inductive element via the second capacitance.

14. The method of claim 13, wherein the first inductive element and the second inductive element are complementary in shape and substantially oppose one another.

15. The method of claim 11, wherein:
the first capacitive element has a first terminal coupled to the first longitudinal end of the first inductive element and a second terminal coupled to the first longitudinal end of the second inductive element; and
the second capacitive element has a third terminal coupled to the second longitudinal end of the first inductive element and a fourth terminal coupled to the second longitudinal end of the second inductive element.

* * * * *